United States Patent
Otani et al.

(10) Patent No.: US 6,787,922 B2
(45) Date of Patent: Sep. 7, 2004

(54) SEMICONDUCTOR CHIP—MOUNTING BOARD

(75) Inventors: Hiroyuki Otani, Ikoma (JP); Yoshihiko Yagi, Ashiya (JP); Kenichi Yamamoto, Moriguchi (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 10/361,605

(22) Filed: Feb. 11, 2003

(65) Prior Publication Data

US 2003/0116863 A1 Jun. 26, 2003

Related U.S. Application Data

(62) Division of application No. 09/417,307, filed on Oct. 13, 1999, now Pat. No. 6,566,165, which is a division of application No. 08/897,085, filed on Jul. 18, 1997, now Pat. No. 6,061,248.

(30) Foreign Application Priority Data

Jul. 19, 1996 (JP) ............................................. 8-190505

(51) Int. Cl.[7] .............................................. H01L 29/40
(52) U.S. Cl. ...................................... 257/778; 257/737
(58) Field of Search ............................... 257/778, 737, 257/738; 361/777

(56) References Cited

U.S. PATENT DOCUMENTS

| | | |
|---|---|---|
| 3,871,015 A | 3/1975 | Lin et al. |
| 4,801,998 A | 1/1989 | Okuaki |
| 5,186,383 A | 2/1993 | Melton et al. |
| 5,269,453 A | 12/1993 | Melton et al. |
| 5,326,794 A | 7/1994 | Pan et al. |
| 5,346,118 A | 9/1994 | Degani et al. |
| 5,381,307 A | 1/1995 | Hertz et al. |
| 5,400,950 A | 3/1995 | Myers et al. |
| 5,576,362 A | 11/1996 | Watanabe et al. |

FOREIGN PATENT DOCUMENTS

| | | |
|---|---|---|
| EP | 0 620 594 | 10/1994 |
| JP | 58-53837 | 3/1983 |
| JP | 5-183247 | 7/1993 |
| JP | 405259626 A | 10/1993 |
| JP | 405299469 A | 11/1993 |
| JP | 407153798 A | 6/1995 |

OTHER PUBLICATIONS

Database EPIL on Questel, week 1995, 17, London: Derwent Publications Ltd., AN 1995–126843, JP 07–050537 A (Fujitsu General LTD), abstract.

Database WPIL on Quest I, week 1995–02, London: Derwent Publications LTD., AN 1995–008835, JP 06–216276 A (Samsung Electronics Co, LTD.), abstract.

*Primary Examiner*—Roy Potter
(74) *Attorney, Agent, or Firm*—Wenderoth, Lind & Ponack, L.L.P.

(57) ABSTRACT

A strengthening land is formed on a semiconductor chip-mounting board corresponding to a non-operating electrode on a semiconductor chip. The strengthening land and the non-operating electrode are bonded with each other, thereby improving a bonding strength between the semiconductor chip and the semiconductor chip-mounting board.

5 Claims, 8 Drawing Sheets

SEMICONDUCTOR CHIP—MOUNTING BOARD

This is a divisional application of Ser. No. 09/417,307, filed Oct. 13, 1999, now U.S. Pat. No. 6,566,165 which is a divisional application of Ser. No. 08/897,085, filed Jul. 18, 1997, now U.S. Pat. No. 6,061,248.

BACKGROUND OF THE INVENTION

The present invention relates to a semiconductor chip-mounting board wherein a semiconductor chip is connected to a semiconductor chip-mounting face by a flip chip-mounting method, and electrodes formed on a circuit board-mounting face opposed to the semiconductor chip-mounting face are electrically connected to electrodes on a circuit board, and a method for mounting the semiconductor chip to the semiconductor chip-mounting board.

Wire bonding using metallic wires has been widely employed heretofore to electrically connect electronic microcircuit elements such as semiconductor chips or the like with electrode terminal parts on a circuit board. However, with the recent higher integration tendency in semiconductor chips and the increase of terminals, the narrowing of connection pitches has resulted. At the same time, personal computers, portable remote terminals, etc. need efficient use of a mounting area on the semiconductor chip. Because of this, a flip chip-mounting method is adopted lately whereby bumps (projecting terminals) are formed on electrode terminals on the semiconductor chip and are directly connected with electrodes on the circuit board by a bonding material, and besides, a minute bonding and mounting technique to resin circuit boards with low cost performance is required.

A semiconductor chip-mounting board having a semiconductor chip mounted according to the conventional flip chip-mounting method and a method for mounting a semiconductor chip to the semiconductor chip-mounting board will be described with reference to the drawings.

FIG. 6 is a plan view of a conventional semiconductor chip-mounting board 4 with a semiconductor chip 1 mounted thereon. FIG. 7 is a sectional view taken along the line III—III of FIG. 6, and FIG. 8 is a sectional view taken along the line IV—IV of FIG. 6. A reference numeral 20 in FIG. 6 is a through hole penetrating a semiconductor chip-mounting face 4a and a circuit board-mounting face 4b of the semiconductor chip-mounting board 4 to electrically connect the semiconductor chip with a circuit board.

On a circuit formation face 1a of the semiconductor chip 1 are formed electrode terminals 13 via an interval of 120 $\mu$m in a peripheral part of the semiconductor chip 1. The electrode terminals 13 which are necessary for general functions of the semiconductor chip are provided with bumps 6 each having a two-step projection of a large diameter part 6a and a small diameter part 6b. The bump 6 is formed of gold of 75 $\mu$m larger diameter and 45 $\mu$m height.

On the other hand, the conventional semiconductor chip-mounting board 4 is formed of glass epoxy resin, having a thermal expansion coefficient of 13 ppm and a glass transition point of 115–120° C. Strip-shaped bonding lands 2 are formed every 120 $\mu$m at positions of the semiconductor chip-mounting face 4a of the board 4 corresponding to electrode terminals 13 formed on the semiconductor chip 1. A width w2 of the bonding land is 50 $\mu$m. As indicated in FIG. 8, the bonding land 2 extends a length L2 from a contact point 6c thereof to the bump 6 towards a central part 107 of the semiconductor chip 1. The above L2 is conventionally 35 $\mu$m. Moreover, as shown in FIG. 9, a solder resist 9 is formed a distance r2 separated from an end face 1b of the semiconductor chip 1 at the semiconductor chip-mounting face 4a of the board 4. The r2 is conventionally 200 $\mu$m.

A method for mounting the semiconductor chip 1 to the conventional semiconductor chip-mounting board 4 will be described.

In the first place, the above-described bumps 6 are formed at the electrode terminals 13 of the semiconductor chip 1 functionally required for the normal operation, that is, terminals necessary for inputting/outputting signals to the circuit board via the mounting board 4. A bonding material 7 of conductive resin paste mainly composed of silver is previously transferred by a thickness of approximately 10 $\mu$m to the bumps 6.

Then, as shown in FIG. 6, the semiconductor chip 1 having the bumps 6 to which the bonding material 7 is transferred is electrically bonded by the bonding material 7 via the bumps 6 to the bonding lands 2 formed at the semiconductor chip-mounting face 4a of the board 4. After the bonding material 7 is dried at 120° C. for two hours to thereby be set, a sealing resin 8 is injected between the semiconductor chip 1 and the semiconductor chip-mounting face 4a, and set by heating at 120° C. for two hours. FIG. 10 shows the semiconductor chip-mounting board 4 having a plurality of semiconductor chips 1 mounted thereon. The sealing resin 8 is applied from one side of the semiconductor chip 1 in a direction indicated by arrows 12 by a dispenser. Where to inject the sealing resin 8 is suitably selected depending on a shape of the semiconductor chip 1 or a distance to the peripheral lands.

The conventional semiconductor chip-mounting board 4 in the structure and the mounting method have the following disadvantages.

Since a bonding strength between the bump 6 of the semiconductor chip 1 and the bonding land 2 on the mounting board 4 is as small as about 3 g per bump, the semiconductor chip 1 with a small count of electrode terminals 13 is poorly bonded to the mounting board 4. Moreover, the bonding material 7 cannot form a sufficient fillet due to a small area of the bonding land 2, and rather spreads, on the semiconductor chip-mounting 4a, wide with a width w12 larger than the width w2 of the bonding land 2 as shown in FIG. 7 and with a length Lf2 larger than the length L2 of the bonding land 2 as shown in FIG. 8. This causes short circuits and deteriorations in insulating resistance. The aforementioned width wf2 is 100 $\mu$m and the length Lf2 is 50 $\mu$m.

Further, since the thermal expansion coefficient of the conventional mounting board 4 is larger than that of silicon which is the material for the semiconductor chip 1, when the sealing resin 8 is heated and set after the semiconductor chip 1 is mounted onto the mounting board 4, a stress is generated due to a difference of thermal expansion coefficients of the mounting board 4 and the semiconductor chip 1. This stress acts to a bonded part between the bump 6 and the bonding land 2 where the bonding strength is small as discussed above, and consequently, a resistance value at the bonded part might be increased or the bonded part might be disconnected.

The semiconductor chip-mounting board 4 uses the material mainly composed of glass epoxy resin as mentioned before. Therefore, when the temperature of the semiconductor chip-mounting board 4 rises to not lower than the glass transition point (Tg), a thermal expansion coefficient $\alpha 1$ before the glass transition point of the board 4 is increased by 5–7 times up to a thermal expansion coefficient α2 at the glass transition point, as is clearly shown in FIG. 11, whereby a deformation amount of the board 4 becomes large.

The semiconductor chip-mounting board 4 with the semiconductor chip 1 mounted is passed through the drying/setting process at 120° C. for two hours so as to dry and set the above bonding material 7 formed at the bumps 6. At this time, when the temperature decreases from 120° C. after the bonding material 7 is set, the semiconductor chip-mounting board 4 warps to be a semiconductor chip-mounting board 4' shown in FIG. 12.

Moreover, the sealing resin 8 injected between the mounting board 4 and the semiconductor chip 1 after the above drying/setting process is subjected to the setting process at 120° C. for two hours. When the temperature decreases from 120° C. after the sealing resin 8 is set, the semiconductor chip-mounting board 4 warps to be a semiconductor chip-mounting board 4" shown in FIG. 13.

When the mounting board 4 is mounted to the circuit board by the SMT prior to the above setting processes of the bonding material 7 and sealing resin 8, the temperature of the mounting board 4 is raised at this time to a maximum of 230° C. That is, the mounting board 4 is accompanied with warping also on the occasion of the SMT mounting.

Since the glass transition point of the conventional semiconductor chip-mounting board 4 is lower than the temperature at which the bonding material 7 or sealing resins is dried/set, this enlarges the above warp of the mounting board 4 resulting from the difference of thermal expansion coefficients. Consequently, the resistance value at the bonded part might be increased and the bonded part might be disconnected.

In the conventional semiconductor chip-mounting board 4, the solder resist 9 is arranged in the vicinity of the end face 1b of the semiconductor chip 1. Therefore, the sealing resin 8 might not form the fillet sufficiently. In addition, because of the small adhering strength of the sealing resin 8 onto the solder resist 9, the solder resist 9 might be separated during an environmental test from the sealing resin 8 at an interface therebetween, which is an important issue from the viewpoint of product quality.

When the sealing by the sealing resin 8 is to be inspected, since an injection opening for the sealing resin 8 is formed at a position difficult to find in the conventional mounting method, it takes a large amount of time for an automatic inspecting device to recognize the injection opening and inspect the formed fillet of the sealing resin 8, thereby disadvantageously decreasing productivity.

If leadless semiconductor chips conformed to the SMT and conventional lead components are mixedly arranged at the mounting board, since the SMT is carried out first, the semiconductor chip-mounting board 4 warps in the heating process thereto, and therefore the bonding resistance at the bonded part is increased. At the same time, the reliability at the bonded part might be lowered because of the adhesion of dust and residual flux, which greatly might influence product quality. Also an additional process is required for cleaning the above dust, etc., whereby the productivity is decreased and costs are increased.

SUMMARY OF THE INVENTION

The present invention is devised to overcome the above-described drawbacks and has for its object to provide a semiconductor chip-mounting board enabling high-quality mounting of semiconductor chips with high productivity and a mounting method for mounting semiconductor chips to the semiconductor chip-mounting board.

In accomplishing these and other aspects, according to a first aspect of the present invention, there is provided a semiconductor chip-mounting board which includes a semiconductor chip-mounting face where bonding lands are formed and electrically connected in a flip chip-mounting method to electrodes formed at a circuit formation face of a semiconductor chip, and a circuit board-mounting face opposed to the semiconductor chip-mounting face and electrically connected to a circuit board, wherein a strengthening land is further provided at the semiconductor chip-mounting face, the strengthening land being connected via a bonding material to a non-operating electrode formed on the circuit formation face and functionally not related to the semiconductor chip, thereby to increase a connection strength between the semiconductor chip and the semiconductor chip-mounting board.

According to a second aspect of the present invention, there is provided a semiconductor chip-mounting board according to the first aspect, wherein the electrode and the non-operating electrode of the semiconductor chip are provided with bumps, via which the electrodes and the lands, and the non-operating electrode and the strengthening land are electrically connected with each other by the bonding material.

According to a third aspect of the present invention, there is provided a semiconductor chip-mounting board according to the second aspect, wherein the lands and the strengthening land formed on the semiconductor chip-mounting face are strip-shaped extending radially to the mounted semiconductor chip, in a length preventing the bonding material from spreading beyond a width thereof over the semiconductor chip-mounting face and in a direction from a contact point thereof to the bumps to a central part of the semiconductor chip.

According to a fourth aspect of the present invention, there is provided a semiconductor chip-mounting board according to any one of the first to third aspects, containing a material having a thermal expansion coefficient not smaller than that of silicon.

According to a fifth aspect of the present invention, there is provided a semiconductor chip-mounting board according to any one of the first to fourth aspects, having a glass transition point exceeding drying and setting temperatures of the bonding material.

According to a sixth aspect of the present invention, there is provided a semiconductor chip-mounting board according to any one of the first to fifth aspects, wherein a sealing resin is injected between the semiconductor chip and the semiconductor chip-mounting board after the semiconductor chip is mounted to the semiconductor chip-mounting board, and the board has a glass transition point exceeding a setting temperature of the sealing resin.

According to a seventh aspect of the present invention, there is provided a semiconductor chip-mounting board according to any one of the first to sixth aspects, wherein the non-operating electrode is formed of the same material as the electrodes on the circuit formation face of the semiconductor chip in a process of forming the electrodes on the circuit formation face.

According to an eighth aspect of the present invention, there is provided a method for mounting a semiconductor chip to a semiconductor chip-mounting board which includes a semiconductor chip-mounting face with bonding lands and a circuit board-mounting face opposed to the semiconductor chip-mounting face and electrically connected to a circuit board, the method comprising: facing a circuit formation face of the semiconductor chip to the semiconductor chip-mounting face; and electrically connecting electrodes formed on the circuit formation face with the bonding lands, and a non-operating electrode formed on the circuit formation face and functionally not related to the semiconductor chip with a strengthening land for increasing a connection strength of the semiconductor chip onto the semiconductor chip-mounting board, via a bonding material by a flip-chip mounting method.

According to a ninth aspect of the present invention, there is provided a method for mounting a semiconductor chip, according to the eighth aspect, including, after the semiconductor chip is mounted to the semiconductor chip-mounting board, forming a solder resist at a part on the semiconductor chip-mounting face which is separated a distance not smaller than a sum of a thickness of the semiconductor chip and a gap between the semiconductor chip-mounting face and the circuit formation face from a projected position, onto the semiconductor chip-mounting face, from a side face of the semiconductor chip in a direction opposite to the semiconductor chip.

According to a tenth aspect of the present invention, there is provided a method for mounting a semiconductor chip according to the eighth aspect or ninth aspect, whereby, when a sealing resin is provided between the semiconductor chip and the semiconductor chip-mounting board, an injection start mark enabling recognition of an injection start position of the sealing resin is formed at the semiconductor chip-mounting face.

According to an eleventh aspect of the present invention, there is provided a method for mounting a semiconductor chip according to any one of the eighth to tenth aspects, wherein the semiconductor chip-mounting board contains a material having a thermal expansion coefficient of not smaller than that of silicon, and has a glass transition point exceeding a drying and a setting temperatures of the bonding material, whereby the sealing resin is provided between the semiconductor chip and the semiconductor chip-mounting board after the semiconductor chip is mounted to the semiconductor chip-mounting board, a setting temperature of the sealing resin being exceeded by the glass transition point of the semiconductor chip-mounting board.

According to a twelfth aspect of the present invention, there is provided a method for mounting a semiconductor chip according to the eleventh aspect, whereby, after the sealing resin is provided, the semiconductor chip-mounting board is mounted to the circuit board by a solder according to SMT.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
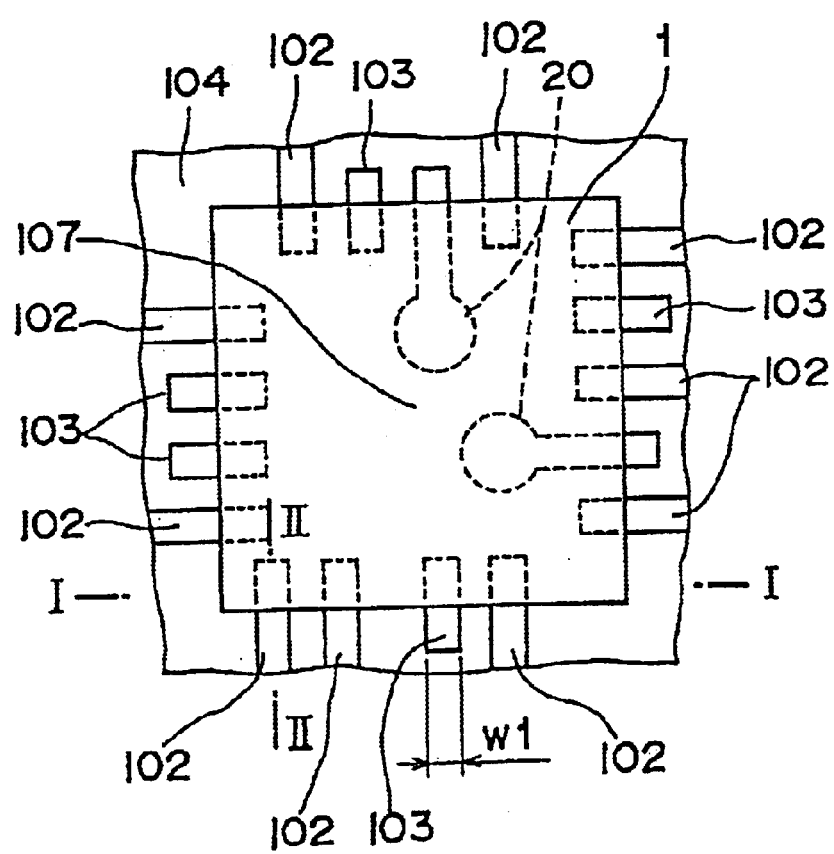
FIG. 1 is a plan view of a semiconductor chip-mounting board with a semiconductor chip mounted thereon according to an embodiment of the present invention.

Before the description of the present invention proceeds, it is to be noted that like parts are designated by like reference numerals throughout the accompanying drawings.

A semiconductor chip-mounting board and a method for mounting a semiconductor chip to the semiconductor chip-mounting board in one embodiment of the present invention will be described below with reference to the drawings. The same parts or parts functioning the same are designated by the same numerals in the drawings. A semiconductor chip-mounting board will be described first.

Figure 2:
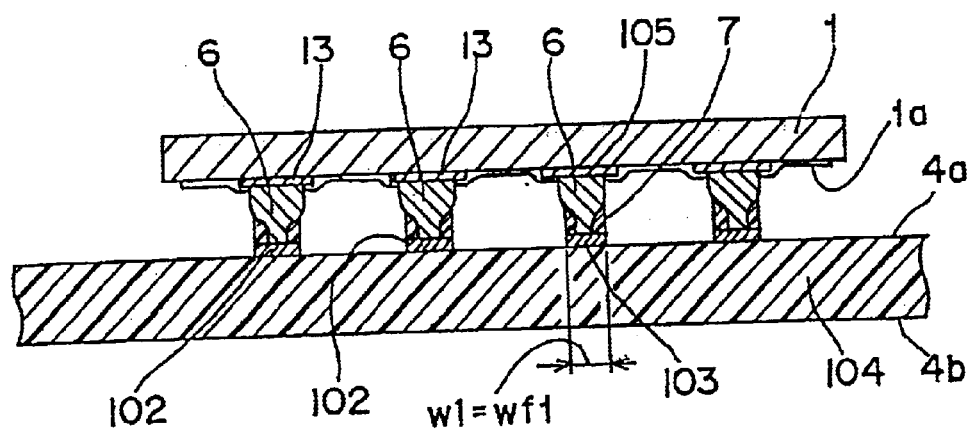
FIG. 2 is a sectional view taken along the line I—I of FIG. 1.
Figure 3:
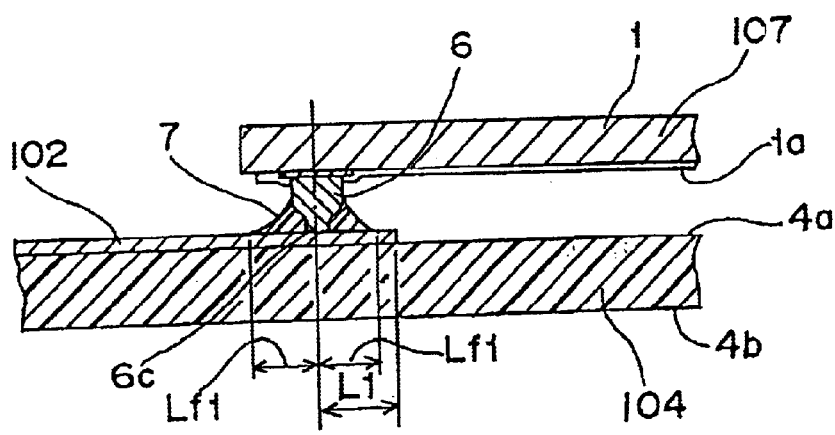
FIG. 3 is a sectional view taken along the line II—II of FIG. 1.
Figure 6:
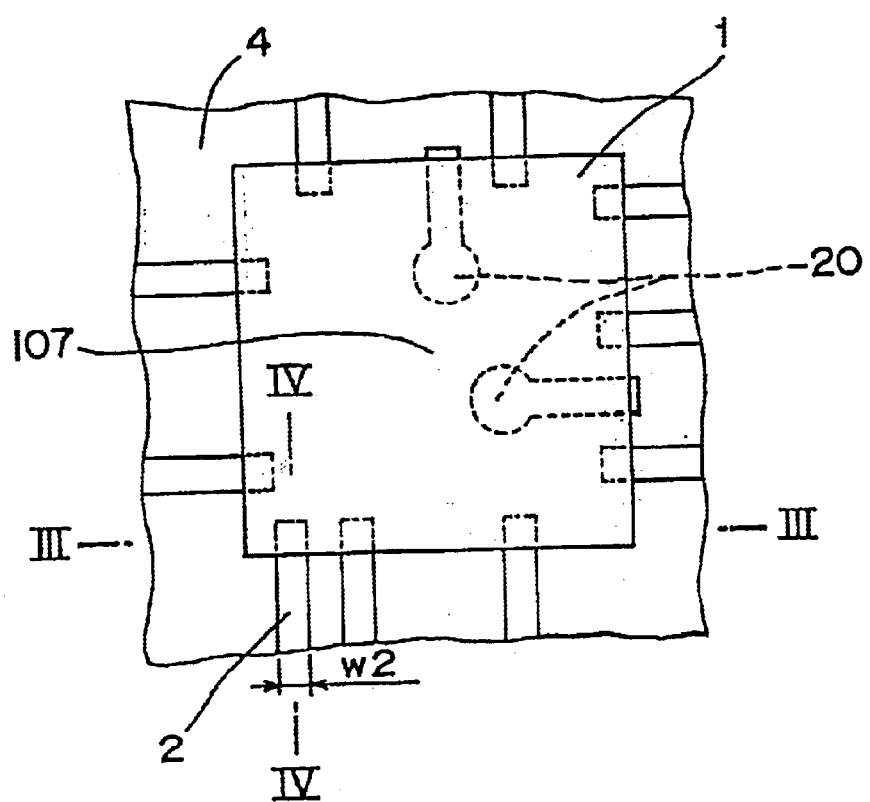
FIG. 6 is a plan view of a conventional semiconductor chip-mounting board with a semiconductor chip mounted thereon.

FIG. 1 corresponds to FIG. 6 referred to above, and FIGS. 2 and 3 are sectional views taken along the line I—I and II—II in FIG. 1, respectively.

Non-operating electrodes 105 are provided on a circuit formation face 1a of the semiconductor chip 1, which are, e.g., test electrodes conventionally used for testing a single body of the semiconductor chip and functionally not related to the semiconductor chip 1 after the semiconductor chip is mounted. If the non-operating electrodes 105 are not present at all or not enough in count, or not present at required places, the non-operating electrodes 105 may be formed with the use of the same material as that of the electrodes 13 when the electrodes 13 functionally necessary for the semiconductor chip 1 are formed.

Strengthening lands 103 are formed, corresponding to the non-operating electrodes 105, at the semiconductor chip-mounting face 4a of a mounting board 104. The lands 103 are not electrically connected to a wiring on the circuit board to which the semiconductor chip-mounting board 104 is mounted. The strengthening lands 103 are formed like strips as shown in FIG. 1, having a width w1 of 50 μm in the embodiment. Each interval of the electrode terminals 13 and non-operating electrodes 105 of the semiconductor chip 1 is 120 μm equal to the foregoing description.

Figure 7:
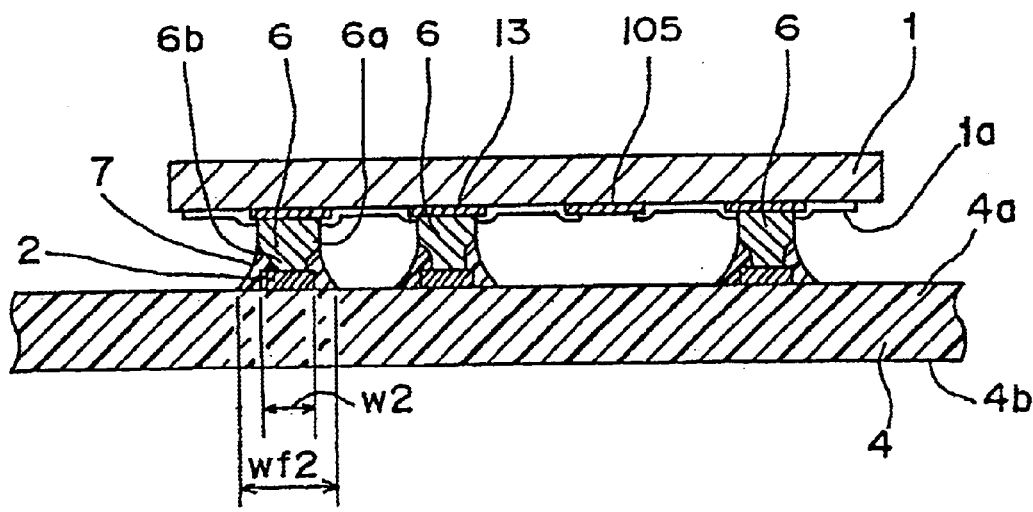
FIG. 7 is a sectional view taken along the line III—III of FIG. 6.

In the thus-constituted semiconductor chip-mounting board 104 and semiconductor chip 1, the non-operating electrodes 105 and strengthening lands 103 are bonded by the bonding material 7 via the bumps 6 in the same manner as the electrode terminals 13 which are formed on the circuit formation face 1a of the semiconductor chip 1 and are functionally necessary for the semiconductor chip 1 are bonded by the bonding material 7 via the bumps 6 with the bonding lands 102 which are formed on the semiconductor chip-mounting face 4a of the mounting board 104 corresponding to the electrode terminals 13 and 15 electrically connected to the wiring on the circuit board. The bump 6 is equal to the above-described one with reference to FIG. 7.

A count of bonded points of the semiconductor chip 1 and semiconductor chip-mounting board 104 is increased as above, whereby the bonding strength therebetween can be enhanced. Even if the semiconductor chip-mounting board 104 has a larger thermal expansion coefficient than silicon which is the material for the semiconductor chip 1, a thermal stress generated, for example, when the bonding material 7 is heated at 120° C. for two hours to be set can be less applied to the bonded parts of the electrode terminals 13 and the bonding lands 102. Thus, the semiconductor chip 1 can be mounted with high quality to the semiconductor chip-mounting board 104 of the embodiment, achieving high productivity. The semiconductor chip-mounting board 104 is formed of the conventionally used resin material and therefore can be manufactured inexpensively.

Figure 8:
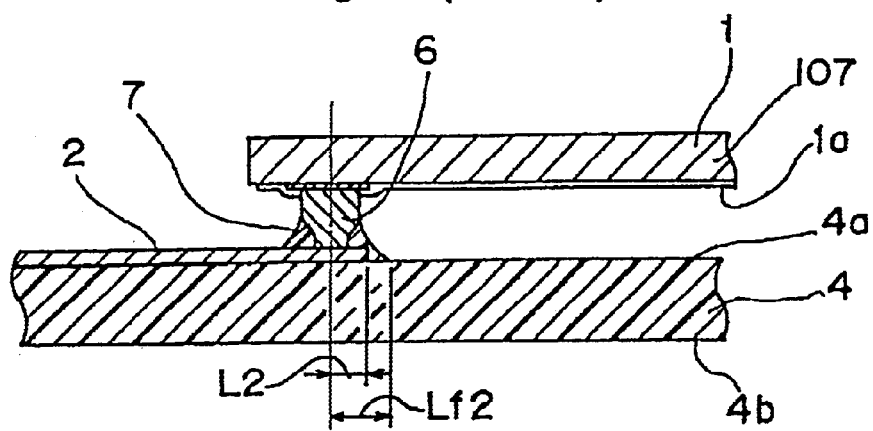
FIG. 8 is a sectional view taken along the line IV—IV of FIG. 6.
Figure 9:
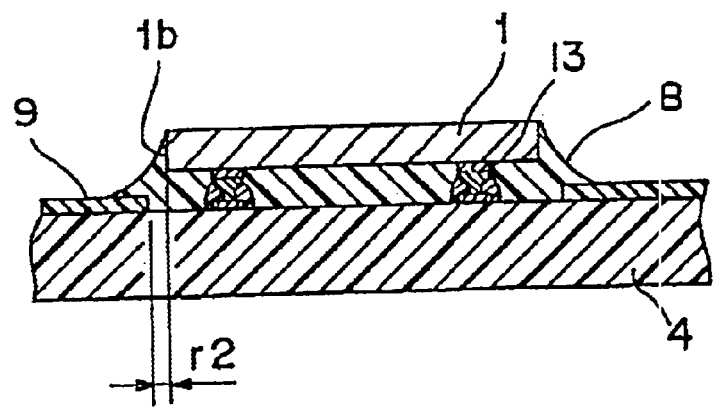
FIG. 9 is a diagram of the conventional semiconductor chip-mounting board provided with a sealing resin.
Figure 10:
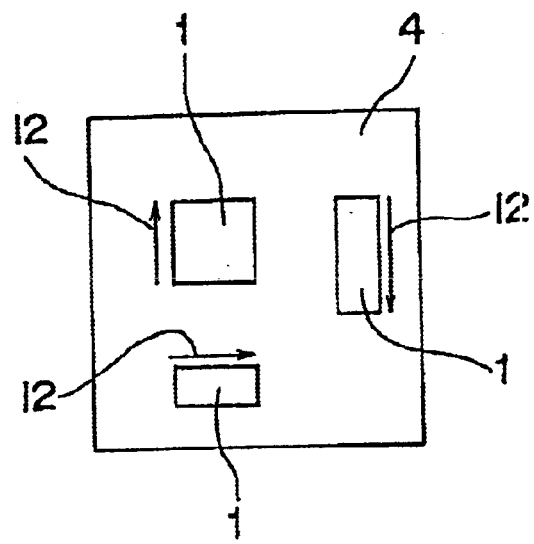
FIG. 10 is a diagram showing an injection direction of the sealing resin in the conventional semiconductor chip-mounting board.

Each of the bonding lands 102 and strengthening lands 103 formed at the semiconductor chip-mounting face 4a of the board 104 is, as indicated in FIG. 3, extended longer than in the prior art towards the central part 107 of the semiconductor chip 1 from a contact point 6c to the bump 6. More specifically, as described with reference to FIG. 8, the bonding land 2 is extended 35 μm (=L2) to the central part of the semiconductor chip 1 from the contact point 6c between the bonding land 2 and the bump 6 in the prior art. On the other hand, as shown in FIG. 3, each of distances to end parts of the bonding land 102 and strengthening land 103 from the contact points 6c is approximately 85 μm according to the embodiment.

Since the distances from the contact points 6c to the end parts of the bonding land. 102 and strengthening land 103 are made larger than in the prior art, the bonding material 7 can form the fillet to extend in a lengthwise direction of each of the bonding land 102 and strengthening land 103, as represented by Lf1 in FIG. 3. Therefore, even though the bonding land 102 and strengthening land 103 have the width w1 of the same value as in the prior art, the bonding land 7 can be prevented from forming the fillet by spreading over the mounting face 4a with exceeding the width w1 of each of the bonding land 102 and strengthening land 103. A width wf1 of the bonding material 7 can be accordingly not larger than the width w1 of each of the bonding land 102 and strengthening land 103. The above Lf1 is approximately 50 μm, as one example.

Even when the electrode terminals 13 are formed via a considerably narrowed distance on the semiconductor chip 1, the generation of shortcircuits between the adjacent bonding lands 102 on the semiconductor chip-mounting face 4a or deterioration in insulating resistance can be prevented, while the sufficient fillet is obtained. The semiconductor chip-mounting board 104 enables the semiconductor chip 1 to be mounted with high quality, thereby achieving high productivity.

An improvement in material of the semiconductor chip-mounting board 104 so as to mount the semiconductor chip 1 with higher quality will be described.

Figure 11:
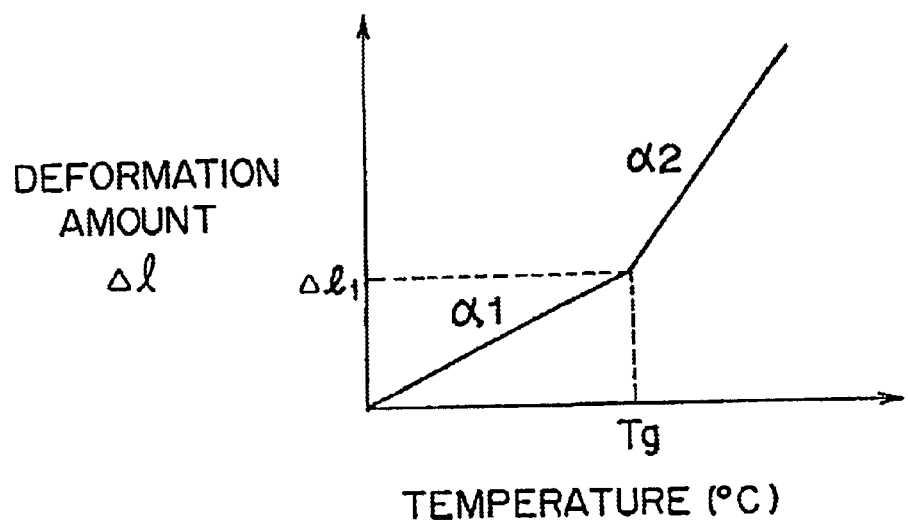
FIG. 11 is a graph of a relation between a temperature and the amount of thermal expansion/deformation of the semiconductor chip-mounting board.
Figure 12:
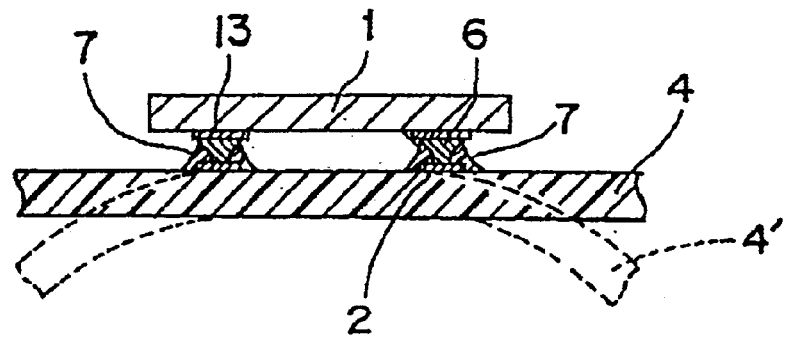
FIG. 12 is a diagram showing a deformation of the semiconductor chip-mounting board in a process setting a bonding material.
Figure 13:
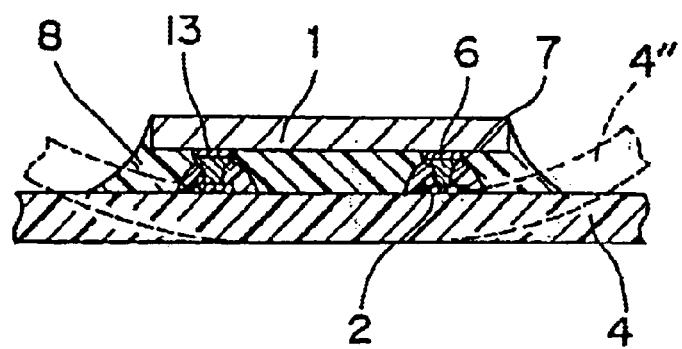
FIG. 13 is a diagram showing a deformation of the semiconductor chip-mounting board in a process setting the sealing resin.

As discussed with reference to FIGS. 11–13, the glass transition point of the conventional semiconductor chip-mounting board 4 is 115–120° C., i.e., lower than 120° C. which is the temperature to set the bonding material 7 or sealing resin 8, and the above-described issues are hence inherent in the prior art.

On the other hand, the semiconductor chip-mounting board 104 of the embodiment uses glass epoxy resin of a glass transition point of 170° C. A thermal expansion coefficient of the board 104 is the same 13 ppm as in the prior art.

When the above semiconductor chip-mounting board 104 is used, since the glass transition point of the board 104 is higher than the set temperature of the bonding material 7 and sealing resin 8, the differences of the thermal expansion coefficients at the setting times of the bonding material 7 and sealing resin 8 can be decreased, so that the warping of the mounting board 104 can be actually measured to be 100 μm/100 mm. The stresses acting to the bonded parts between the bumps and lands can be reduced, that is, the bonding reliability can be improved.

According to the embodiment, the semiconductor chip 1 is mounted and sealed to the semiconductor chip-mounting board 104 before the semiconductor chip-mounting board 104 is mounted to the circuit board by the SMT. With the use of this method, since the semiconductor chip is prevented from being mounted to the thermally warped semiconductor chip-mounting board as in the prior art, the bonded parts can be improved in quality. Moreover, since the semiconductor chip 1 is mounted and sealed prior to the SMT mounting, the adhesion of dust to the semiconductor chip 1 or remaining of flux is not brought about. The bonded parts can be accordingly improved in reliability and cannot be required to be cleaned. The productivity can be improved and costs can be reduced.

In the semiconductor chip-mounting board 104 in the embodiment, an arrangement position of the solder resist to the semiconductor chip-mounting face 4a of the mounting board 104 is devised.

Figure 4:
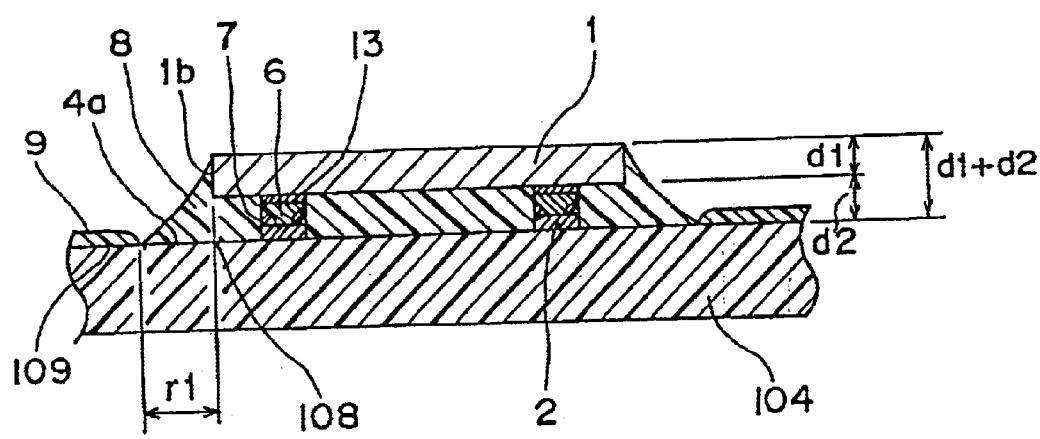
FIG. 4 is a diagram indicating a position where a sealing resin is injected at the semiconductor chip-mounting board in the embodiment of the present invention.

Specifically, as shown in FIG. 4, the semiconductor chip 1 is bonded to the semiconductor chip-mounting face 4a, and the sealing resin 8 is provided between the semiconductor chip 1 and the semiconductor chip-mounting board 104. The solder resist 9 is formed at a part 109 of the mounting face 104a which is separated a distance r1 from the end face 1b of the semiconductor chip 1 at a projected position 108 onto the mounting face 4a in a direction opposite to the semiconductor chip. The distance r1 is not smaller than the sum of a gap d2 between the mounting face 4a and the semiconductor chip 1 and a thickness d1 of the semiconductor chip 1.

Figure 5:
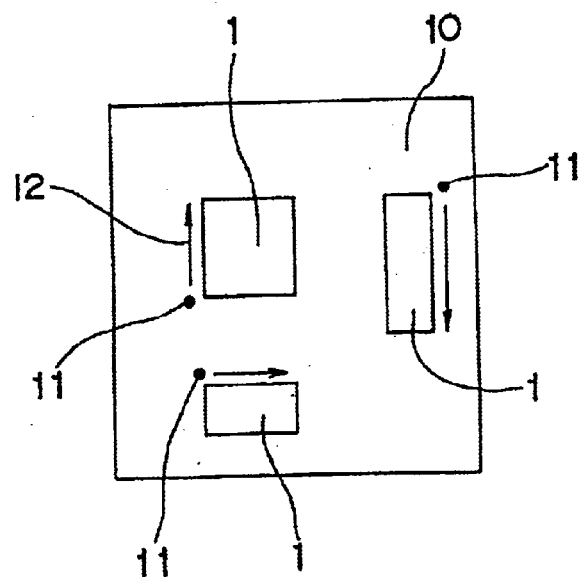
FIG. 5 is a diagram indicating an injection start position and an injection direction of the sealing resin in the semiconductor chip-mounting board in the embodiment of the present invention.

For injecting the sealing resin 8 using a dispenser, an injection start mark 11 is formed at the semiconductor chip-mounting face 4a to indicate a position where to start to inject the sealing resin 8. In FIG. 5, a multi-chip module (MCM) 10 having a plurality of semiconductor chips 1 mounted onto one semiconductor chip-mounting board is illustrated. The sealing resin 8 is injected along the arrow 12 from the injection start mark 11 indicated for every semiconductor chip 1.

Since the solder resist 9 is arranged at the suitable position as mentioned above, the fillet of the sealing resin 8 is formed from an upper face of the semiconductor chip 1, not riding over the solder resist 9. Accordingly, the fillet of the sealing resin 8 is formed sufficiently, thereby to improve quality reliability.

The injection start mark 11 allows the recognition of an injection start position and an injection direction of the sealing resin 8. Therefore, when the sealing is inspected, the formation of the fillet can be inspected in a short time by an automatic inspecting device, thus improving productivity.

As is fully described hereinabove, according to the semiconductor chip-mounting board in a first aspect of the present invention and the method for mounting a semiconductor chip in an eighth aspect of the present invention, not only are the bonding lands on the mounting board bonded with the electrodes on the semiconductor chip, but strengthening lands are provided on the mounting board to be connected with the non-operating electrodes on the semiconductor chip and connected therein. Therefore, a count of bonded points between the semiconductor chip and the semiconductor chip-mounting board is increased, whereby the bonding strength therebetween can be increased. The stress resulting, for example, from the difference of thermal expansion coefficients of the semiconductor chip and the semiconductor chip-mounting board can be reduced and can less influence the bonded parts between the electrodes and the bonding lands. Accordingly, the semiconductor chip-mounting board enables the semiconductor chip to be mounted with high quality, and accomplishes high productivity.

The entire disclosure of Japanese Patent Application No. 8-190505 filed on Jul. 19, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A semiconductor chip-mounting board comprising a semiconductor chip-mounting face where bonding lands are formed and are electrically connected in a flip chip-mounting method to electrodes formed at a circuit formation face of a semiconductor chip, and a circuit board-mounting face, opposed to the semiconductor chip-mounting face, which allows an electrical connection to be established between the semiconductor chip-mounting board and a circuit board;

wherein a strengthening land is further provided at the semiconductor chip-mounting face, the strengthening land being connected via a bonding material to a non-operating electrode formed on the circuit formation face and functionally not related to the semiconductor chip, thereby to increase a connection strength between the semiconductor chip and the semiconductor chip-mounting board; and wherein the strengthening land formed on the semiconductor chip-mounting face is strip-shaped extending radially to the mounted semiconductor chip in a length preventing the bonding material from spreading beyond a width thereof over the semiconductor chip-mounting face, and in a direction from a contact point thereof to a bump on the non-operating electrode to a central part of the semiconductor chip, and an inner end of the strengthening land extends toward the central part of the semiconductor chip beyond an inner end of the bump connecting the strengthening land to the non-operating electrode.

2. A semiconductor chip-mounting board according to claim 1, containing a material having a thermal expansion coefficient not smaller than that of silicon.

3. A semiconductor chip-mounting board according to claim 1, wherein the non-operating electrode is formed of the same material as the electrodes on the circuit formation face of the semiconductor chip in a process of forming the electrodes on the circuit formation face.

4. A semiconductor chip-mounting board according to claim 2, wherein the non-operating electrode is formed of the same material as the electrodes on the circuit formation face of the semiconductor chip in a process of forming the electrodes on the circuit formation face.

5. A semiconductor chip-mounting board comprising a semiconductor chip-mounting face where bonding lands are formed and are electrically connected in a flip chip-mounting method to electrodes formed at a circuit formation face of a semiconductor chip;

wherein a strengthening land is provided at the semiconductor chip-mounting face, the strengthening land being connected via a bonding material to a non-operating electrode formed on the circuit formation face and functionally not related to the semiconductor chip, thereby to increase a connection strength between the semiconductor chip and the semiconductor chip-mounting board; and wherein the strengthening land formed on the semiconductor chip-mounting face is strip-shaped extending radially to the mounted semiconductor chip in a length preventing the bonding material from spreading beyond a width thereof over the semiconductor chip-mounting face, and in a direction from a contact point thereof to a bump on the non-operating electrode to a central part of the semiconductor chip, and an inner end of the strengthening land extends toward the central part of the semiconductor chip beyond an inner end of the bump connecting the strengthening land to the non-operating electrode.

* * * * *

UNITED STATES PATENT AND TRADEMARK OFFICE
CERTIFICATE OF CORRECTION

PATENT NO. : 6,787,922 B2
DATED : September 7, 2004
INVENTOR(S) : Hiroyuki Otani et al.

It is certified that error appears in the above-identified patent and that said Letters Patent is hereby corrected as shown below:

Title page,
Item [56], References Cited, OTHER PUBLICATIONS, please replace "Database EPIL on Questel, week 1995, 17, London: Derwent Publications Ltd., AN 1995-126843, JP 07-050537 A (Fujitsu General LTD), abstract." with -- Database EPIL on Questel, week 1995, 17, London: Derwent Publications Ltd., AN 1995-126843, JP 07-050357 A (Fujitsu General LTD), abstract. --.

Column 9,
Line 39, replace "connected in" with -- connected by --.

Column 10,
Line 30, replace "connected in" with -- connected by --.

Signed and Sealed this

Seventeenth Day of May, 2005

JON W. DUDAS
*Director of the United States Patent and Trademark Office*